(12) United States Patent
Farmer et al.

(10) Patent No.: US 6,665,471 B1
(45) Date of Patent: Dec. 16, 2003

(54) SYSTEM AND METHOD FOR OPTIMIZING THE PERFORMANCE OF MULTIPLE GAIN ELEMENT LASER

(75) Inventors: Jason N. Farmer, Seattle, WA (US); Scott R. Karlsen, Lynnwood, WA (US); Mark R. Pratt, Seattle, WA (US)

(73) Assignee: Nlight Photonics Corporation, Seattle, WA (US)

( * ) Notice: Subject to any disclaimer, the term of this patent is extended or adjusted under 35 U.S.C. 154(b) by 42 days.

(21) Appl. No.: 09/929,837

(22) Filed: Aug. 13, 2001

(51) Int. Cl.[7] .................................................. G02B 6/34
(52) U.S. Cl. .............................. 385/37; 385/24; 372/23; 372/97; 372/99; 372/102; 398/87
(58) Field of Search ................................ 385/24, 31, 37, 385/33; 372/6, 69, 102, 92, 108, 98, 43, 39, 23, 93, 97, 99, 101, 20; 359/130, 124, 133, 333, 341.1, 341.5; 398/87, 79, 91

(56) References Cited

U.S. PATENT DOCUMENTS

| | | | |
|---|---|---|---|
| 4,923,270 A | 5/1990 | Carter ........................... 385/24 |
| 5,115,444 A | 5/1992 | Kirkby et al. ................. 372/50 |
| 5,163,058 A | 11/1992 | Farries et al. .................. 372/6 |
| 5,319,668 A | 6/1994 | Luecke ....................... 372/107 |
| 5,331,651 A * | 7/1994 | Becker et al. ................. 372/32 |
| 5,351,262 A | 9/1994 | Poguntke et al. ........... 372/102 |
| 5,379,310 A | 1/1995 | Papen .......................... 372/23 |
| 5,386,426 A | 1/1995 | Stephens ..................... 372/20 |
| 5,510,920 A | 4/1996 | Ota .............................. 398/63 |
| 5,528,612 A | 6/1996 | Scheps et al. ................ 372/23 |
| 5,570,226 A | 10/1996 | Ota ............................ 359/333 |
| 5,773,345 A | 6/1998 | Ota ............................ 438/286 |
| 6,028,879 A * | 2/2000 | Ershov ........................ 372/57 |
| 6,052,394 A | 4/2000 | Lee et al. ....................... 372/6 |
| 6,192,062 B1 | 2/2001 | Sanchez-Rubio et al. ..... 372/92 |
| 6,208,679 B1 | 3/2001 | Sanchez-Rubio et al. ..... 372/92 |
| 6,212,216 B1 * | 4/2001 | Pillai ............................ 372/96 |
| 6,456,756 B1 * | 9/2002 | Mead et al. .................. 385/24 |
| 2002/0085594 A1 * | 7/2002 | Pezeshki et al. ............. 372/20 |
| 2002/0159140 A1 * | 10/2002 | Fan ............................ 359/349 |

* cited by examiner

Primary Examiner—Thong Nguyen
Assistant Examiner—Arnel C. Lavarias
(74) Attorney, Agent, or Firm—Fulbright & Jaworski L.L.P.

(57) ABSTRACT

The present invention is directed to a system and method which utilize an incoherently beam combined (IBC) laser. The IBC laser includes a plurality of emitters with each of the emitters possessing a partially reflective surface on their front facet. The partially reflective surface causes resonant wavelengths to be defined. In certain embodiments, the system and method arrange the external cavity and emitter spacings of the IBC laser such that the center feedback wavelength provided to each emitter is an etalon resonant wavelength. In other embodiments, the range of feedback wavelengths is adapted so that it is greater than the free spectral range (the separation in wavelength space between adjacent etalon resonant wavelengths).

24 Claims, 2 Drawing Sheets

SYSTEM AND METHOD FOR OPTIMIZING THE PERFORMANCE OF MULTIPLE GAIN ELEMENT LASER

BACKGROUND OF THE INVENTION

Incoherently beam combined (IBC) lasers combine the output from an array of gain elements or emitters (typically consisting of semiconductor material, such as GaAlAs, GaAs, InGaAs, InGaAsP, AlGaInAs, and/or the like, which is capable of lasing at particular wavelengths) into a single output beam that may be coupled into, for example, an optical fiber. The gain elements may be discrete devices or may be included on an integrated device. Due to the geometry of IBC lasers, each gain element tends to lase at a unique wavelength.

FIG. 1 depicts a prior art arrangement of components in IBC laser 10. IBC laser includes emitters 12-1 through 12-N associated with fully reflective surface 11. Emitters 12-1 through 12-N are disposed in a substantially linear configuration that is perpendicular to the optical axis of collimator 15 (e.g., a lens). Collimator 15 causes the plurality of beams produced by emitters 12-1 through 12-N to be substantially collimated and spatially overlapped on a single spot on diffraction grating 16. Additionally, collimator 15 directs feedback from partially reflective 17 via diffraction grating 16 to emitters 12-1 through 12-N.

Diffraction grating 16 is disposed from collimator 15 at a distance approximately equal to the focal length of collimator 15. Furthermore, diffraction grating 16 is oriented to cause the output beams from emitters 12-1 through 12-N to be diffracted on the first order toward partially reflective component 17, thereby multiplexing the output beams. Partially reflective component 17 causes a portion of optical energy to be reflected. The reflected optical energy is redirected by diffraction grating 16 and collimator 15 to the respective emitters 12-1 through 12-N. Diffraction grating 16 angularly separates the reflected optical beams causing the same wavelengths generated by each emitter 12-1 through 12-N to return to each respective emitter 12-1 through 12-N. Accordingly, diffraction grating 16 is operable to demultiplex the reflected beams from reflective component 17.

It shall be appreciated that the geometry of external cavity 13 of IBC laser 10 defines the resonant wavelengths of emitters 12-1 through 12-N. The center wavelength ($\lambda_i$) of the wavelengths fed back to the $i^{th}$ emitter 12-i is given by the following equation: $\lambda_i = A[\sin(\alpha_i) + \sin(\beta)]$. In this equation, A is the spacing between rulings on diffraction grating 16, $\alpha_i$ is the angle of incidence of the light from the $i^{th}$ emitter on diffraction grating 16, and $\beta$ is the output angle which is common to all emitters 12-1 through 12-N. As examples, similar types of laser configurations are also discussed in U.S. Pat. No. 6,208,679.

To allow emitters 12-1 through 12-N to operate in this type of configuration, anti-reflective coating 14 is applied to the front facet of emitters 12-1 through 12-N. Anti-reflective coating 14 allows substantially all incident light to be transmitted. By applying anti-reflective coating 14, emitters 12-1 through 12-N lase at the wavelength defined by the feedback wavelengths as discussed above. Specifically, it shall be appreciated that emitters 12-1 through 12-N do not operate as Fabry-Perot emitters, since anti-reflective coating 14 does not provide a partially reflective surface to create internal feedback.

Moreover, anti-reflective coatings of appreciable quality (possessing a reflectivity on the order of $10^{-4}$) are difficult to achieve on a consistent basis. This is problematic, since anti-reflective coatings of lower quality can significantly diminish performance of an IBC laser.

Additionally, the use of anti-reflective components increases the difficulty of verifying the performance of components in an IBC laser. Specifically, it is desirable to verify the performance of each emitter prior to assembling the entire laser. Performance verification of an emitter array is performed by applying current through the emitters of the emitter array and measuring the output optical power over a period of time. If a very low reflectivity is applied to the front facet, the emitter array will not generate a significant amount of optical power and performance verification is not possible. As a result, the entire IBC laser must be assembled before the various components can be tested. Accordingly, this greatly increases the cost of manufacturing IBC lasers.

BRIEF SUMMARY OF THE INVENTION

The present invention is directed to a system and method which utilize an incoherently beam combined (IBC) laser. The IBC laser includes a plurality of emitters with each of the emitters possessing a partially reflective surface on their front facet. The partially reflective surface causes resonant wavelengths to be defined. In certain embodiments, the system and method arrange the external cavity and emitter spacings of the IBC laser such that the center feedback wavelength provided to each emitter is an etalon resonant wavelength. In other embodiments, the range of feedback wavelengths is adapted so that it exceeds the free spectral range (the separation in wavelength space between adjacent etalon resonant wavelengths).

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention

BRIEF DESCRIPTION OF THE DRAWING

For a more complete understanding of the present invention, reference is now made to following descriptions taken in conjunction with the accompanying drawing, in which.

DETAILED DESCRIPTION OF THE INVENTION

Figure 2:
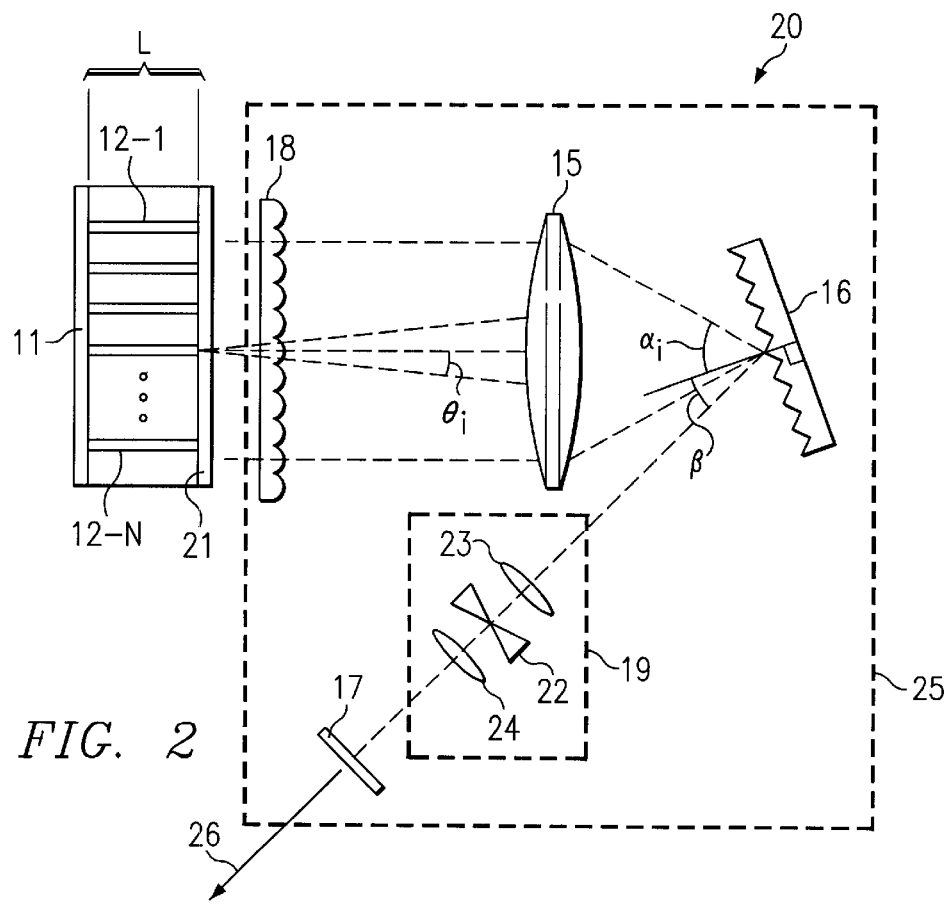
FIG. 2 depicts an exemplary IBC laser according to embodiments of the present invention.

FIG. 2 depicts IBC laser 20 which is adapted according to embodiments of the present invention. IBC laser 20 includes emitters 12-1 through 12-N which can advantageously be implemented on a single device or array via photolithographic techniques. Emitters 12-1 through 12-N have a front surface and a back surface that are referred to as facets. Each facet has a reflectivity which determines how much incident light is reflected. The back facet is coated with highly reflective coating 11 causing it to reflect almost all incident light. The front facet is coated with partially reflective coating 21 causing it to reflect a portion of light and to allow transmission of a portion of light. It shall be appreciated that embodiments of the present invention are not limited to any particular implementation of emitters 12-1 through 12-N. Any number of designs may be utilized including, but not limited to, edge emitters, vertical cavity surface emitting lasers (VCSELs), and grating surface emitting lasers. Accordingly, the term "emitter" is intended to mean any gain material or element capable of lasing in response to feedback.

The two surfaces of emitters 12-1 through 12-N define an etalon. Specifically, reflective coatings 11 and 21 cause multiple internal reflections of light emitted by emitters 12-1 through 12-N. The etalons defined by reflective coatings 11 and 21 of emitters 12-1 through 12-N cause light at specific wavelengths to build up to high energy levels between the facets of emitters 12-1 through 12-N. This is referred to as a resonance condition. The wavelengths are referred to as resonant wavelengths. The $j^{th}$ resonant wavelength, $\lambda_j$, of an etalon is given by $$\lambda_j = 2nL/j$$

where n is the index of refraction and L is the distance between the two facets. These resonant wavelengths are separated in wavelength space from one another by an amount referred to as the free spectral range which is given by:

$$\lambda_j - \lambda_{j+1} = \Delta\lambda_{FSR} \approx \lambda^2/2nL$$

where $\lambda_j$ and $\lambda_{j+1}$ are adjacent resonant wavelengths of light. Wavelengths $\lambda_j$ and $x\lambda_{j+1}$ are typically very nearly equal, so the wavelength $\lambda$ in the above expression is an average.

Light at non-resonant wavelengths will not build up to very high energy levels inside the etalon. The degree to which these non-resonant wavelengths are suppressed is governed by the finesse of the etalons. High finesse etalons strongly reject all non-resonant wavelengths, while low finesse etalons provide weak rejection. High finesse etalons result from higher facet reflectivities while low finesse etalons result from low reflectivities.

Figure 1:
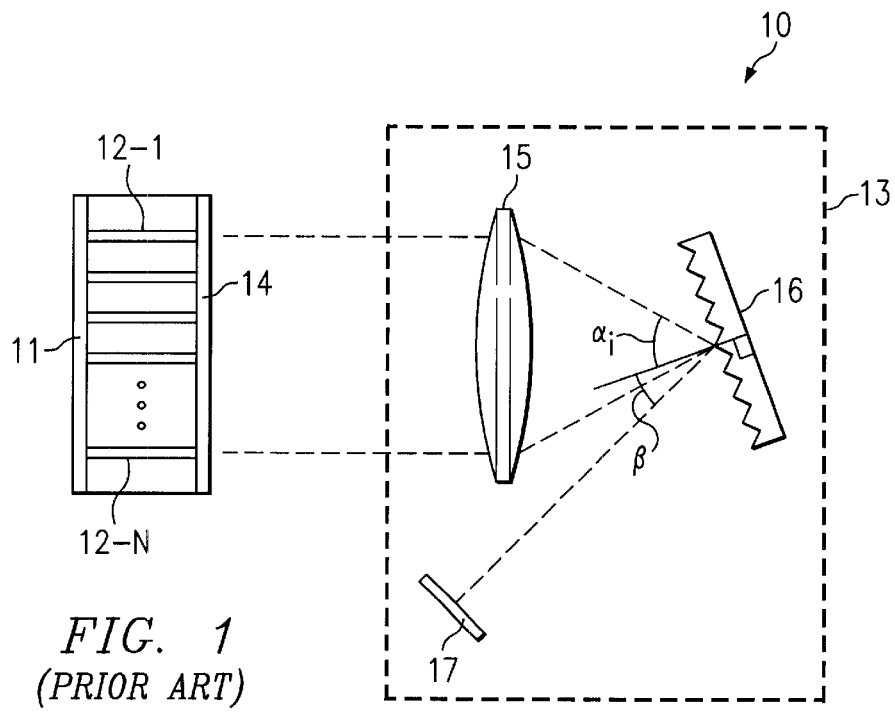
FIG. 1 depicts a prior art arrangement of components in an IBC laser.

IBC laser 20 comprises external cavity 25 which provides feedback to emitters 12-1 through 12-N and combines output beams from emitters 12-1 through 12-N to produce output beam 26. External cavity 25 comprises collimator 15 and diffraction grating 16 as described in connection with FIG. 1. Collimator 15 causes the plurality of beams produced by emitters 12-1 through 12-N to be spatially overlapped on a single spot on diffraction grating 16. Additionally, collimator 15 directs feedback from diffraction grating 16 to emitters 12-1 through 12-N.

Diffraction grating 16 is disposed from collimator 15 at a distance approximately equal to the focal length of collimator 15. Furthermore, diffraction grating 16 is oriented to cause the output beams from emitters 12-1 through 12-N to be diffracted on the first order toward partially reflective component 17, thereby multiplexing the output beams. Partially reflective component 17 may be embedded in an optical fiber. Partially reflective component 17 causes a portion of optical energy to be reflected, while the portion that is transmitted is output beam 26. The reflected optical energy is redirected by diffraction grating 16 and collimator 15 to the respective emitters 12-1 through 12-N. Diffraction grating 16 angularly separates the reflected optical beams causing the same wavelengths generated by each emitter 12-1 through 12-N to return to each respective emitter 12-1 through 12-N. Accordingly, diffraction grating 16 is operable to demultiplex the reflected beams from partially reflective component 17.

Although IBC laser 20 utilizes diffraction grating 16 to provide feedback to emitters 12-1 through 12-N and to multiplex their output beams, other feedback and multiplexing elements may be substituted such as arrayed waveguide gratings and Mach-Zehnder interferometers. Also, transmission diffraction gratings, prisms, holograms, and other dispersive elements may be utilized in lieu of reflective diffraction grating 16. The particular dispersive element used in a given application will influence the geometry of external cavity 25.

Moreover, the geometry of external cavity 25 of IBC laser 20 defines the resonant wavelengths of emitters 12-1 through 12-N. As previously noted, the center wavelength ($\lambda_i$) of the wavelengths fed back to the $i^{th}$ emitter 12 is given by the following equation: $\lambda_i = A[\sin(\alpha_i) + \sin(\beta)]$. In this equation, A is the spacing between rulings on diffraction grating 16, $\alpha_i$ is the angle of incidence of the light from the $i^{th}$ emitter on diffraction grating 16, and $\beta$ is the output angle which is common to all emitters 12. Additionally, the range of wavelengths, $\Delta\lambda_i$, fed back to the $i^{th}$ emitter 12 is given by:

$$\Delta\lambda_i = \frac{\lambda_i A \cos(\alpha_i)}{2C_0 f \theta_i}$$

where $C_0$ is of order 1 which is determined by the beam shape on diffraction grating 16, $f$, is the focal length of collimator 15, and $\theta_i$ is the half angle divergence of light exiting the $i^{th}$ emitter 12-i in the plane of the array. This range of wavelengths, $\Delta\lambda_i$, is distributed around the $i^{th}$ emitter's center wavelength $\lambda_i$. Most of the optical energy is fed back at the center wavelength.

It shall be appreciated that each emitter 12-1 through 12-N is subjected to two different wavelength constraints. Specifically, the feedback provided by external cavity 25 and the resonant wavelengths defined by the etalons constrain the operation of emitters 12-1 through 12-N. If the center wavelength, $\lambda_i$, falls between two of the etalon resonant wavelengths ($\lambda_j$ and $\lambda_{j+1}$) and if the range of wavelengths ($\Delta\lambda_i$) is less than the free spectral range ($\Delta\lambda_{FSR}$) of the etalon, then the feedback is rejected by the etalon. In this case, IBC laser 20 is not able to control the wavelength of the $i^{th}$ emitter.

In certain embodiments of the present invention, this problem is solved by selecting each center wavelength ($\lambda_i$) fed back to each emitter to equal a resonant wavelength ($\lambda_j$). By selecting each center wavelength ($\lambda_i$) in this manner, the external cavity feedback is allowed to control the wavelengths of emitters 12-1 through 12-N. This can be achieved by selectively placing emitters 12 at specific locations on the emitter array utilizing, for example, photo-lithographic techniques.

In other embodiments of the present invention, this problem is solved by forcing the range of feedback wavelengths, $\Delta\lambda_i$, to exceed the free spectral range, $\Delta\lambda_{FSR}$, of the etalons. In this manner, each emitter 12-1 through 12-N receives feedback including at least one of the resonant wavelengths, $\lambda_j$, of the etalon regardless of $\lambda_j$. This condition can be satisfied by selectively tuning the grating resolution of external cavity 25 of IBC laser 20. In an embodiment, the grating resolution of external cavity 25 is tuned by adjusting the divergence, $\theta_i$, of the output beams from emitters 12-1 through 12-N. The divergence, $\theta_i$, is tuned or adjusted by placing micro-lens component 18 in the output beams of emitters 12-1 through 12-N. Micro-lens component 18 includes a series of discrete lens elements each associated with an emitter 12-i to reduce the divergence of that emitter 12-i. Micro-lens component 18 can be implemented utilizing, for example, photo-lithographic techniques.

It shall also be appreciated that the range of wavelengths, $\Delta\lambda_i$, fed back to the $i^{th}$ emitter is not solely dependent on its divergence angle, $\theta_i$, after passing through micro-lens component 18. It is also dependent on the focal length, $f$, of collimator 15, the ruling density, A, and the angle of incidence, $\alpha_i$. In other embodiments, these parameters can also be adjusted to provide the desired range of wavelengths, $\Delta\lambda_i$.

Figure 3:
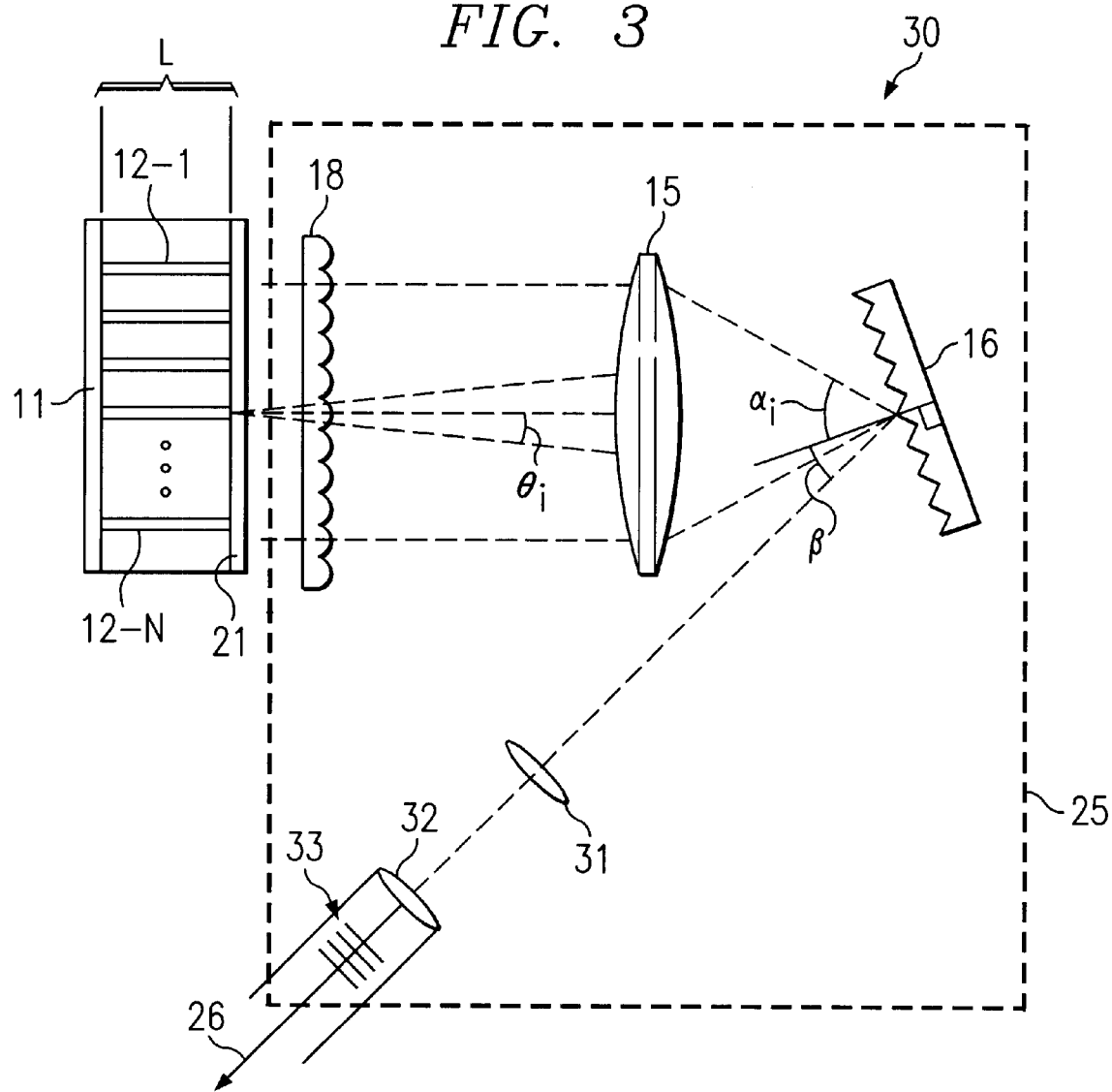
FIG. 3 depicts another exemplary IBC laser according to embodiments of the invention.

Additionally, it is advantageous to spatially filter output beams that are not co-aligned with output beam 26 exiting external cavity 25 of IBC laser 20. By performing spatial filtering, parasitic cross-talk modes between emitters 12-1 through 12-N are reduced to adapt to the modified resolution of external cavity 25. In this example, IBC laser 20 performs spatial filtering conventionally via spatial filter 19 which may comprise slit 22 disposed between lenses 23 and 24. Other spatial filtering mechanisms can be employed such as depicted in IBC laser 30 of FIG. 3. For example, single lens 31 can be utilized to couple output beam 26 into fiber 32. A partial reflector (e.g., a fiber Bragg grating 33) can be embedded in fiber 32 to complete external cavity 25. Beams that are not co-aligned are not coupled into fiber 32 and, hence, are not reflected. Accordingly, the aperture of fiber 32 can accomplish the desired spatial filtering for particular applications as desired.

Both of the techniques described above allow IBC laser 20 to simultaneously satisfy the constraints imposed by feedback from external cavity 25 and the resonant wavelength constraints imposed by the etalons. Accordingly, IBC laser 20 provides significant advantages by allowing the use of a partially reflective surface on the front facet of emitters 12-1 through 12-N. First, manufacturing difficulties associated with achieving high quality anti-reflective surfaces are eliminated. Secondly, verification of discrete components (e.g., emitters 12-1 through 12-N) of IBC laser 20 can occur prior to assembly of IBC laser 20. Accordingly, these advantages provide significant cost reductions for the manufacture of IBC laser 20.

In other embodiments, IBC laser 20 can be utilized as the excitation source for another laser or laser amplifier. IBC laser 20 can provide its output beam to excite a gain medium that is doped with appropriate materials. For example, IBC laser 20 can excite an optical fiber doped with any of the following materials: Ce, Pr, Nd, Er, Tm, Ho, and Yb. In addition, multiple doping materials can be utilized. In particular, it is advantageous to dope a gain medium with both Yb and Er. It shall be appreciated that the use of IBC laser 20 as the excitation source is advantageous for these types of applications. Specifically, IBC laser 20 is capable of providing a relatively high output power to excite the particular gain medium, because IBC laser 20 is operable to combine the output beams from a plurality of emitters.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed as new and desired to be protected by Letters Patent of the United States is:

1. A system for combining a plurality of output beams, comprising:

an array of optical gain elements, each of said optical gain elements of said array possessing a first reflective surface and a second reflective surface which define resonant wavelengths, and each of said optical gain elements of said array producing an output beam; and an external cavity, for providing feedback to said array of optical gain elements, that includes:

an optical wavelength multiplexing element operable to multiplex output beams from said optical gain elements of said array as a multi-wavelength beam; and a partial reflector operable to reflect a portion of said multi-wavelength beam as a reflected portion, wherein said optical wavelength multiplexing element is operable to demultiplex said reflected portion to provide feedback beams to each of said optical gain elements of said array such that each of said optical gain elements receives a spectrally unique feedback beam;

each of said feedback beams possessing at least one wavelength component that substantially coincides with a resonant wavelength of said resonant wavelengths;

wherein each feedback beam possesses a bandwidth, wherein said resonant wavelengths define a free spectral range, and wherein the bandwidth of each feedback beam is at least as great as said free spectral range.

2. The system of claim 1 wherein each feedback beam possesses a center wavelength and wherein each center wavelength of the feedback beams is approximately equal to a resonant wavelength of said resonant wavelengths.

3. The system of claim 1 wherein said optical wavelength multiplexing element comprises:

a collimating optical assembly; and a dispersive element.

4. The system of claim 3 wherein said dispersive element comprises at least one item from the list of:

a reflective diffraction grating;

a transmission diffraction grating;

a prism; and a hologram.

5. The system of claim 1 wherein said optical multiplexing element comprises an element selected from the group consisting of arrayed waveguide gratings and Mach-Zehnder interferometers.

6. The system of claim 1 further comprising:

a micro-lens component operable to adjust divergence of each of said output beams.

7. The system of claim 6 further comprising:

a spatial filter operable to reduce cross-talk.

8. The system of claim 7 wherein said spatial filter comprises a lens and an aperture of an optical fiber.

9. The system of claim 1 further comprising:

a gain medium being operable to receive said portion of said multiplexed beam that is transmitted by said partial reflector, and wherein said gain medium is doped with at least one material from the list of:

Ce;

Pr;

Nd;

Er;

Tm;

Ho; and

Yb.

10. The system of claim 9 wherein said system is an optical amplifier providing optical gain in an optical telecommunications network.

11. A method for combining a plurality of output beams, said method comprising the steps of:

providing an array of gain elements to produce output beams with each gain element of said array of gain elements possessing a first reflective surface and a second reflective surface defining resonant wavelengths;

operating said array of gain element in an external cavity, said external cavity combining output beams from said array of gain elements; and providing feedback to each gain element of said array of gain elements, said feedback provided to each gain element containing at least one wavelength that substantially coincides with a resonant wavelength of said resonant wavelengths, wherein each gain element receives a spectrally unique range of wavelengths as feedback, wherein said resonant wavelengths define a free spectral range, and wherein said step of providing feedback causes said range of wavelengths to be at least as great as said free spectral range.

12. The method of claim 11 further comprising the step of:

adjusting divergence of said output beams.

13. The method of claim 11 wherein each gain element receives a respective center feedback wavelength, and wherein said step of providing feedback causes each respective center feedback wavelength to approximately equal a resonant wavelength of said resonant wavelengths.

14. The method of claim 11 wherein said external cavity comprises:

a collimating optical assembly; and an optical wavelength multiplexing element.

15. The method of claim 14 wherein said external cavity further comprises:

a partial reflector.

16. The method of claim 14 wherein said an optical wavelength multiplexing element comprises a dispersive element selected from the list of:

a reflective diffraction grating;

a transmission diffraction grating;

a prism; and a hologram.

17. The method of claim 11 wherein said external cavity includes an optical wavelength multiplexing comprises one element selected from the group consisting of arrayed waveguide gratings and Mach-Zehnder interferometers.

18. The method of claim 11 further comprising the step of:

spatially filtering a combined output beam.

19. The method of claim 11 further comprising the step of:

launching a combined output beam into an optical medium.

20. An incoherently beam combined laser, comprising:

a plurality of gain elements for generating output beams wherein each gain element is bounded by a first reflective surface and a second reflective surface to cause each gain element to possess sufficient finesse to define resonant and strongly rejected non-resonant wavelengths; and a multiplexing unit being operable to combine output beams from said plurality of gain elements as a multi-wavelength beam, said multiplexing unit being operable to demultiplex a reflected beam from a partially reflective component as feedback beams, and said multiplexing unit being operable to direct said feedback beams to said plurality of gain elements, each of said feedback beams possessing at least one wavelength that substantially coincides with a resonant wavelength of said resonant wavelengths, wherein each feedback beam comprises a center wavelength, and wherein each of said gain element is positioned in an array such that each center wavelength is approximately equal to a resonant wavelength of said resonant wavelengths.

21. The incoherently beam combined laser of claim 20 wherein each feedback beam comprises a bandwidth, wherein said resonant wavelengths define a free spectral range, and wherein each of said bandwidths of said feedback beams is greater than said free spectral range.

22. The incoherently beam combined laser of claim 21 further comprising:

a micro-lens component associated with said plurality of gain elements, said micro-lens adjusting divergence of said output beams generated by said plurality of gain elements.

23. The incoherently beam combined laser of claim 20 wherein said multiplexing unit includes a dispersive element selected from the list of:

a reflective diffraction grating;

a transmission diffraction grating;

a prism; and a hologram.

24. The incoherently beam combined laser of claim 20 wherein said multiplexing unit comprises one element selected from the group consisting of arrayed waveguide gratings and Mach-Zehnder interferometers.

* * * * *